United States Patent [19]

Chu et al.

[11] Patent Number: 5,703,402

[45] Date of Patent: Dec. 30, 1997

[54] OUTPUT MAPPING OF DIE PAD BONDS IN A BALL GRID ARRAY

[75] Inventors: Edwin Chu, Cupertino; Hu-Kong Lai, San Jose, both of Calif.

[73] Assignee: ACC Microelectronics Corporation, Santa Clara, Calif.

[21] Appl. No.: 559,189

[22] Filed: Nov. 13, 1995

[51] Int. Cl.$^6$ .................. H01L 23/48; H01L 23/52; H01L 29/40

[52] U.S. Cl. .................. 257/737; 257/700; 257/780

[58] Field of Search .................. 257/700, 737, 257/780

[56] References Cited

U.S. PATENT DOCUMENTS

| | | | |
|---|---|---|---|
| 5,155,065 | 10/1992 | Schweiss | 437/209 |
| 5,241,133 | 8/1993 | Mullen, III et al. | 174/52.4 |
| 5,269,452 | 12/1993 | Sterczyk | 228/49.2 |
| 5,396,701 | 3/1995 | Russell | 29/832 |
| 5,424,589 | 6/1995 | Dobbelaere et al. | 326/41 |
| 5,468,999 | 11/1995 | Lin et al. | 257/700 |
| 5,490,324 | 2/1996 | Newman | 257/700 |
| 5,498,767 | 3/1996 | Huddleston et al. | 437/8 |

OTHER PUBLICATIONS

Intel® Microprocessors, vol. II (1991), pp. 5–1, 5–6 and 5–8 to 5–12 no month.
Motorola® M68040 User's Manual (1993), pp. 5–1 to 5–3 and 12–1 to 12–2 no month.

*Primary Examiner*—Mahshid D. Saadat
*Assistant Examiner*—T. M. Arroyo
*Attorney, Agent, or Firm*—Thomas Schneck; George B.F. Yee

[57] ABSTRACT

The present invention relates to a substrate for ball-grid arrays. Bond sites are arranged around a die-attach region of the substrate. Signal traces connect the bond sites to vias disposed on the substrate, thus providing an electrical path between both sides of the substrate. Solder balls (solder bumps) are disposed on the other side of the substrate and arranged in a grid-like pattern. The generally linearly-arranged bond sites are sequentially numbered, as is the grid-like arrangement of solder balls. In a preferred embodiment, the bond sites are used only for carrying signals to and from the semiconductor die. In addition, only the solder bumps used for carrying signals are sequentially numbered. In another embodiment of the invention, some of the bond sites may be used for utilities such as ground and power. Such utility bond sites are not numbered. Likewise, utility solder balls are not numbered. The signal bond sites are coupled to vias by signal traces. The vias appear on the other side of the substrate and are coupled to signal solder balls such that the positional order of the corresponding bond sites is mapped to signal solder bumps having the same positional order in the grid-like array. In this way, the sequential linear ordering of the bond sites is preserved when they are mapped to the two-dimensional grid-like array of solder balls.

18 Claims, 8 Drawing Sheets

OUTPUT MAPPING OF DIE PAD BONDS IN A BALL GRID ARRAY

TECHNICAL FIELD

The present invention relates packaging, and more specifically to the output mapping of the bond pads of a semiconductor die in a ball grid array.

BACKGROUND ART

There is a wide variety of chip packages for mounting and encapsulating an semiconductor die. One type is referred to as a ball grid array (BGA) package. A BGA package includes a substrate having an array of solder bumps (solder balls) to be used to provide mechanical and electrical connection to a motherboard or the like.

The semiconductor die is typically connected to the surface of the BGA substrate opposite to the surface having the array of raised solder bumps. U.S. Pat. No. 5,241,133 to Mullen, III et al. describes a chip package in which the semiconductor die is adhered to the top surface of the BGA substrate of the package, so that the input/output pads of the die are exposed. Typically, wire bonds are used to electrically connect the input/output pads of the die to traces or pads on the BGA substrate. If the die is on the side of the BGA substrate opposite to the solder bumps, conductive vias are formed through the substrate to conduct signals from the solder bumps to the pads or traces. A molding compound may then be used to encapsulate the integrated circuit die and the wire bonds and to cover most or all of the surface of the BGA substrate opposite to the solder bumps.

No standards or conventions exist for routing the signal traces on the substrate of a BGA package. Typically, the signal traces are routed in order to simplify the fabrication of BGA packages. Usually, this results in a BGA chip in which groups of adjacent I/O pads on the semiconductor die, such as the data bits of a bus, are arbitrarily distributed among the grid of solder balls.

FIGS. 6 and 7 show the pin-out arrangements for two popular microprocessors, the Intel® i486 chip and the Motorola® MC68040 chip. In order to keep the figures simple, only certain signal pins are shown, namely the address and data pins. Other "signal" pins typically include read/write, bus lock, cache inhibit, data latch, bus request, bus grant, bus busy, reset in, reset out, and so on. The pin assignments for the i486 chip were obtained from FIG. 1.1 of the Intel® data book entitled Microprocessors, Volume II (1991), page 5-6. The pin assignments for the MC68040 chip were obtained from the Motorola® data book entitled M68040 Microprocessors User's Manual (1993), page 12-2. Although the packaging for these chips are pin-grid array packages, their pin-out configurations exhibit the same arbitrary placement of address and data pins as in ball-grid array packages. FIG. 6 shows the pin locations of the address and data pins for the i486 chip, while FIG. 7 shows the address and data pin-outs for the MC68040 chip. Constraints in signal routing similar to those which exist in ball-grid array packaging are present in pin-grid array packages. Therefore, the result is a scattered disordered pattern of address and data pins as evidenced in FIGS. 6 and 7.

Such pin-out configurations can pose problems for the PC board designer. Consider, for example, the address pins A0-A31 and data pins D0-D31 of the MC68040 chip shown in FIG. 7. The address and data lines on the PC board typically will be arranged in sequential order. However, because of the scattered arrangement of the address and data pins on the chip, it is often necessary to route the signal traces along different layers of the PC board in order to avoid crossing the various signal, power supply and ground traces. PC boards having six to eight layers are not uncommon. The use of such a large number of layers in a PC board, however, greatly increases the cost of the board.

An alternative to having the additional layers is to run the traces using the existing layers. A modern PC board generally consists of four metallic layers (or planes): a power supply plane and a ground plane are formed within the PCB material of the board and a signal trace layer is formed on the top and the bottom surfaces of the board. A common practice is to etch into the ground plane and the power supply plane isolated islands of traces which are then connected to the signal plane by vias. These utility planes provide the additional space to form the traces needed to access all of the pins on the chip without having to form additional layers in the PC board. However, this approach sacrifices the integrity of the ground and power supply planes because of the numerous "islands" formed within these planes.

An objective of the present invention is to provide a BGA package which presents signals in such a way that the signal traces on a PC board which access the BGA chip can be routed with minimal signal trace cross-over, thus minimizing the number of islands which must be used.

SUMMARY OF THE INVENTION

An insulative BGA substrate for attachment of a semiconductor die includes, on a first surface, a die-attach region. A plurality of bond sites are arranged on the first surface around the die-attach region, so that bonding wires may be attached between the I/O bond pads of the die and the bond sites on the BGA substrate. At least some of the bond sites serve as "signal" bond sites, providing logic signals to and from the die. In a preferred embodiment of the invention, all of the bond sites serve as signal-carrying bond sites. The "signals" in the present invention and as generally known in art of digital circuit design, are understood to be logic signals, and are to be distinguished from "utilities" such as ground and power. The bond sites are arranged around the die-attach region in a linear order and are sequentially numbered. A plurality of solder bumps (balls) are formed on a second surface of the BGA substrate. At least some of the solder bumps serve as signal solder bumps, while other solder bumps provide utilities such as ground and power. The solder bumps are arranged in a grid pattern and are sequentially numbered.

The bond sites are mapped to corresponding solder bumps such that the sequence number of a bond site matches the sequence number of the corresponding solder bump. Furthermore, each bond site on the first surface has an electrical connection to its corresponding solder bump on the second surface. In one embodiment of the invention, the sequential numbering of the bond sites and the solder bumps is limited to signal bond sites and signal solder bumps so that the utility bond sites and solder bumps are not numbered.

The electrical connection between bond sites and their corresponding solder bumps is accomplished by way of signal traces formed on the first surface of the BGA substrate and conductive vias formed through the substrate. The signal traces provide an electrical path from the bond sites to the vias. The vias, in turn, are electrically coupled to the solder bumps on the second surface. In one embodiment, some of the vias are electrically coupled to the solder bumps by way of signal traces formed on the second surface.

In a preferred embodiment of the invention, an outer region is defined on the first side of the BGA substrate, extending outwardly from the bond sites in a direction away from the die-attach region. An inner region is also defined, extending inwardly from the bond sites in a direction toward the die-attach region. The vias are disposed in one of the outer and the inner regions. In addition, the bond sites of the preferred embodiment are composed of first ends of the signal traces that are formed on the first surface of the substrate, while second ends of the signal traces are connected to the vias.

BEST MODE FOR CARRYING OUT THE INVENTION

Figure 1:
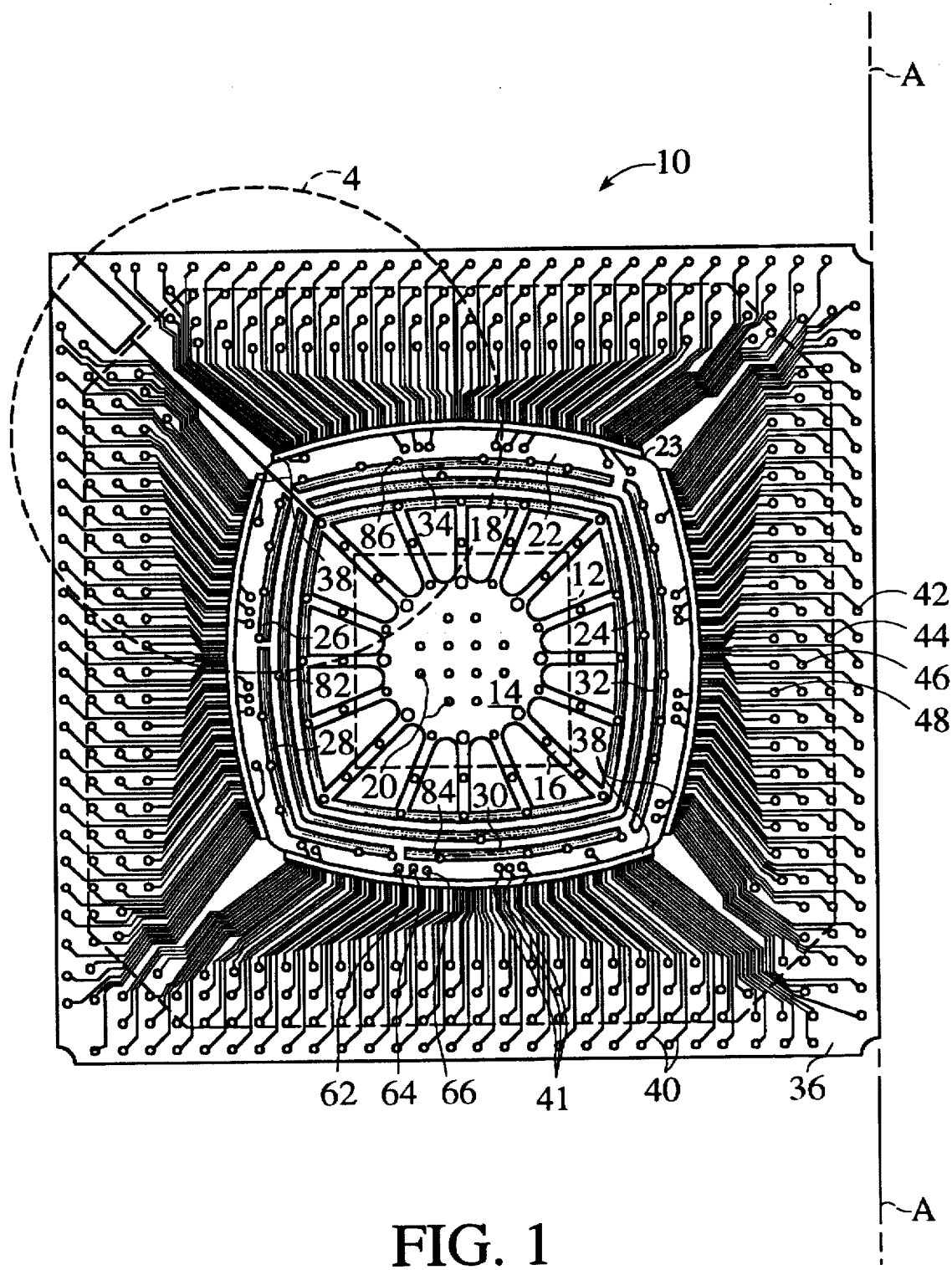
FIG. 1 shows a view of the top side a BGA substrate of an integrated circuit package having a utility region in accordance with the invention.

With reference to FIG. 1, the top side of a BGA substrate 10 is shown having a central die-attach region 12 as indicated by the dashed lines. As will be described more fully below, a semiconductor die is coupled to the die-attach region using conventional techniques. In the embodiment of FIG. 1, the region includes a patterned metallization. At the center of the region is a solid metal area 14. Metallic legs 16 extend radially to a four-sided ground trace 18. Plated through, thermally conductive vias 20 contact the surface of the semiconductor die and are used to conduct thermal energy from the die to the opposite side of the BGA substrate 10. The thermal energy is then conducted to a ground plane layer of a multilayer PC board, to which the BGA package is attached.

Surrounding the die-attach region 12 is an intermediate region 22 bounded by a boundary line 23, shown by the dashed lines. The intermediate region includes "utility" traces, such as a ground bus 18, a $V_{DD}$ bus 24, and a segmented utility trace that includes five bus segments 26, 28, 30, 32 and 34 for providing power to the die.

In the present invention, the term "utility" is to be distinguished from the term "signal." The bond pads of the semiconductor die primarily are composed of I/O pads for providing logic signals to and from the die. In addition to address and data, other "signals" typically include read/ write, bus lock, cache inhibit, data latch, bus request, bus grant, bus busy, reset in, reset out, and so on. The specific signals will vary depending upon the particular kind of chip. Such pads typically are known in the digital circuit arts as "signal" pads. By comparison, "utility" pads serve to provide grounding and power for the semiconductor die. This distinction between "signals" and "utilities" will be adhered to in the discussion of the present invention which follows.

The boundary line 23 separates the intermediate region 22 from an outer signal trace region 36 which surrounds the intermediate region. The signal trace region includes an array of signal traces 40, as is well known in the art. As can been seen in FIG. 1, inner trace ends 38 of the signal traces are aligned along the boundary line 23, and serve as bond sites, providing points of electrical contact for the bond wires, not shown. The function of the bond wires is to conduct signals to and from the integrated circuit die, and to provide fixed electrical potentials for the die. The individual bond wires include inner ends that are bonded to input/ output pads of the die and include outer ends that are bonded to the bond sites 38 (inner trace ends).

The signals are conducted along the surface of the BGA substrate 10 by means of the signal traces 40. Most of the traces 40 extend outwardly from the bond sites in a direction away from the die-attach region 12, into the signal trace region 36, to a plurality of signal vias, exemplified by the signal vias 42, 44, 46 and 48. The signal vias in the signal trace region generally are arranged in a grid-like pattern. Some of the signal traces 41 are formed within the intermediate region 22, extending inwardly from the bond sites 38 toward the die-attach region. These signal traces connect to additional signal vias formed within the intermediate region 22, exemplified by the vias 62, 64 and 66.

In addition to the signal traces are the utility traces mentioned above, such as traces (or buses) 24–34. Like the signal traces 40, 41, the utility traces 24–34 have associated utility vias. For example, utility vias 82, 84 and 86 are formed through a portion of the respective utility traces 24, 30 and 34. Electrical contact of the utility vias to the utility traces is made by virtue of the vias being formed through a portion of the traces.

Figure 2:
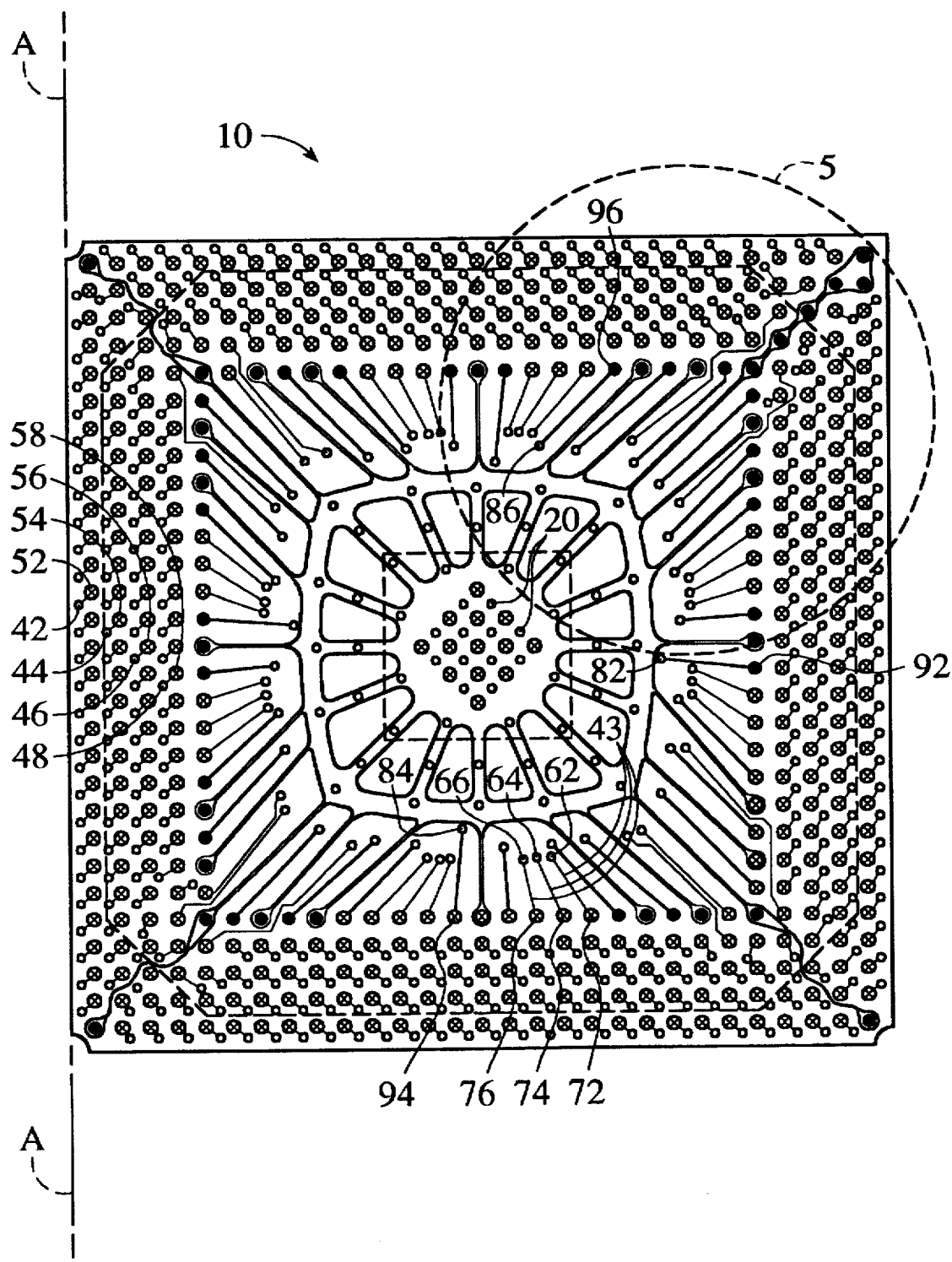
FIG. 2 depicts view of the bottom side of the BGA substrate of FIG. 1, as shown rotated about the axis A—A.

The signal and utility vias are electrically conductive through-holes that are formed using conventional techniques, and participate in the conduction of logic and utility signals to and from the semiconductor die. More specifically, the vias provide a conduction path between the top side of the BGA substrate 10, as shown in FIG. 1, and the bottom side of the substrate, as shown in FIG. 2. As discussed above, signal vias, which carry logic signals, are to be distinguished from the utility vias, which serve as conductive paths for ground and fixed electrical potentials such as $V_{DD}$.

Referring now to FIG. 2, the bottom side of the BGA substrate 10 is shown. The view in FIG. 2 is the bottom of the substrate, exposed by rotating the substrate about the vertical axis A—A. The signal vias 42–48 and 62–66 are shown in their respective positions, as viewed from the bottom. The utility vias 82–86, likewise, are shown as viewed from the bottom.

Solder bumps (solder balls) are formed on the bottom side of the BGA substrate, and are electrically connected to corresponding signal and utility vias. Thus, the signal vias 42–48 have corresponding signal solder bumps 52–58 and the signal vias 62–66 correspond to solder bumps 72–76, as shown in FIG. 2. Likewise, the utility vias 82–86 have corresponding utility solder bumps 92–96. Formation of the solder bumps and the connections to their corresponding vias are accomplished by known conventional techniques. For example, signal traces may be formed on the bottom side of the substrate to connect the vias to the solder bumps in a manner similar to the traces 40, 41 on the top side of the substrate. FIG. 2 shows that traces 43 connect the signal vias 62–66 to corresponding solder bumps 72–76.

In operation, the solder bumps on the bottom surface of the BGA substrate 10 are aligned with a corresponding array of contact pads formed on a PC motherboard. By properly heating the solder, the substrate is surface mounted to the motherboard to provide the necessary power and signal communication between the motherboard and the semiconductor die attached at the top surface of the BGA substrate.

Figure 3:
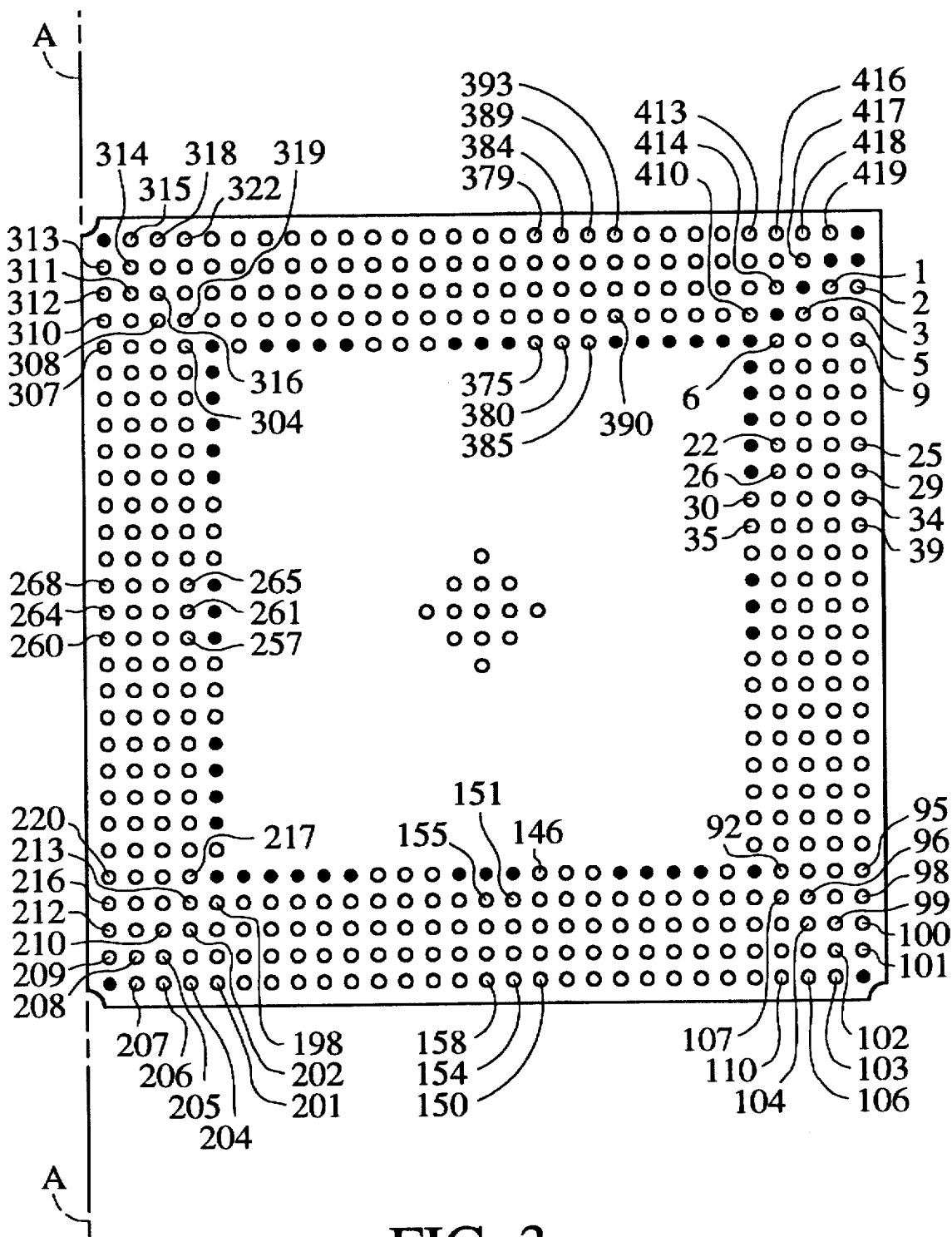
FIG. 3 shows the grid arrangement of the solder bumps formed on the bottom side of the BGA substrate, the view being the bottom side of the substrate of FIG. 1, as shown rotated about the axis A—A.

In accordance with the preferred embodiment of the present invention, the solder bumps are arranged along a grid-like pattern having five rows along each of its four sides, as can be seen in FIG. 2. FIG. 3 more clearly illustrates the grid pattern, providing a schematic representation only of the solder bumps. The illustration of FIG. 3 is a view of the grid, as seen by rotating the BGA substrate 10 about the axis A—A to expose the bottom side of the substrate. In FIG. 3, the utility solder bumps are indicated by filled-in circles, while the signal solder bumps are indicated by open circles.

The signal solder bumps are identified by their ordinal positions on the grid, beginning at a first grid position. Alternatively, the signal solder bumps may be identified by numbering each signal solder bump in sequential order based upon the grid pattern, beginning with a first signal solder bump. It is noted that the specific method of identifying the signal solder bumps is not critical in order to practice the present invention. It is important only that the signal solder bumps be identified according to a sequential or otherwise ordered pattern.

Thus, for example, FIG. 3 illustrates a particular numbering sequence for identifying the signal solder bumps (open circles) according to the present invention. The sequence begins with the first signal solder bump 1. The second solder bump 2 is positioned along a line that is perpendicular to the edge of the BGA substrate 10 and in a direction toward the edge of the substrate. The third solder bump 3 is located on an adjacent line of solder bumps, at a position distal to the edge of the substrate. The fourth and fifth solder bumps 4, 5 are positioned in a manner similar to the positioning of the second solder bump 2, i.e. along a line that is perpendicular to the edge of the BGA substrate 10 and in a direction toward the edge of the substrate. The sixth solder bump 6 begins on the next adjacent line of solder bumps in a manner similar to the third solder bump 3, i.e. at a position distal to the edge of the substrate. Note that the fifth row of solder bumps primarily consists of utility solder bumps (filled-in circles). However, the fifth row also includes signal solder bumps. Where there are signal solder bumps in the fifth row, the numbering sequence includes such solder bumps. This progression continues for the remaining signal solder bumps along each of the four sides of the BGA substrate 10. Thus, the solder bumps 1–101 are numbered in a left-to-right order, solder bumps 102–207 are numbered in a top-to-bottom order, solder bumps 208–313 are numbered in a right-to-left order and solder bumps 314–419 would be numbered in a bottom-to-top order. Since the numbering follows a generally regular pattern, only a selected sample of signal solder bumps is shown numbered, e.g. solder bumps 22–39, 146–158, 257–268 and 375–393. The solder bumps located at the corners, however, are numbered in a slightly altered manner. Additional reference numerals are provided to more clearly show the numbering of these "corner" solder bumps.

As mentioned earlier, the particular numbering method is not critical so long as the signal solder bumps are numbered in an ordered manner. For example, in an alternate embodiment, the sequence illustrated in FIG. 3 may be reversed so that the numbering begins at the outside edge of the substrate and proceeds inwardly. Whereas FIG. 3 shows the numbering of solder bumps in an inside-to-outside order, the solder bumps in the alternate embodiment would be numbered in an outside-to-inside order. Thus, with reference to FIG. 3, the solder bumps along the four sides of the substrate would be numbered as follows: solder bumps 1–101 would be numbered in a right-to-left order; solder bumps 102–207 would be numbered in a bottom-to-top order; solder bumps 208–313 would be numbered in a left-to-right order and solder bumps 314–419 would be numbered in a top-to-bottom order.

In another embodiment, the solder bumps are numbered in a manner that alternates between the two above-described methods. Thus, with reference to FIG. 3, the solder bumps 1–101 would be numbered in inside-to-outside order (i.e. left-to-right), solder bumps 102–207 would be numbered in outside-to-inside order (i.e. bottom-to-top), solder bumps 208–313 would be numbered in inside-to-outside order (i.e. right-to-left) and solder bumps 314–419 would be numbered in outside-to-inside order (i.e. top-to-bottom). In general, the solder bumps along each side of the substrate can be numbered either in inside-to-outside order or outside-to-inside order.

Figure 4:
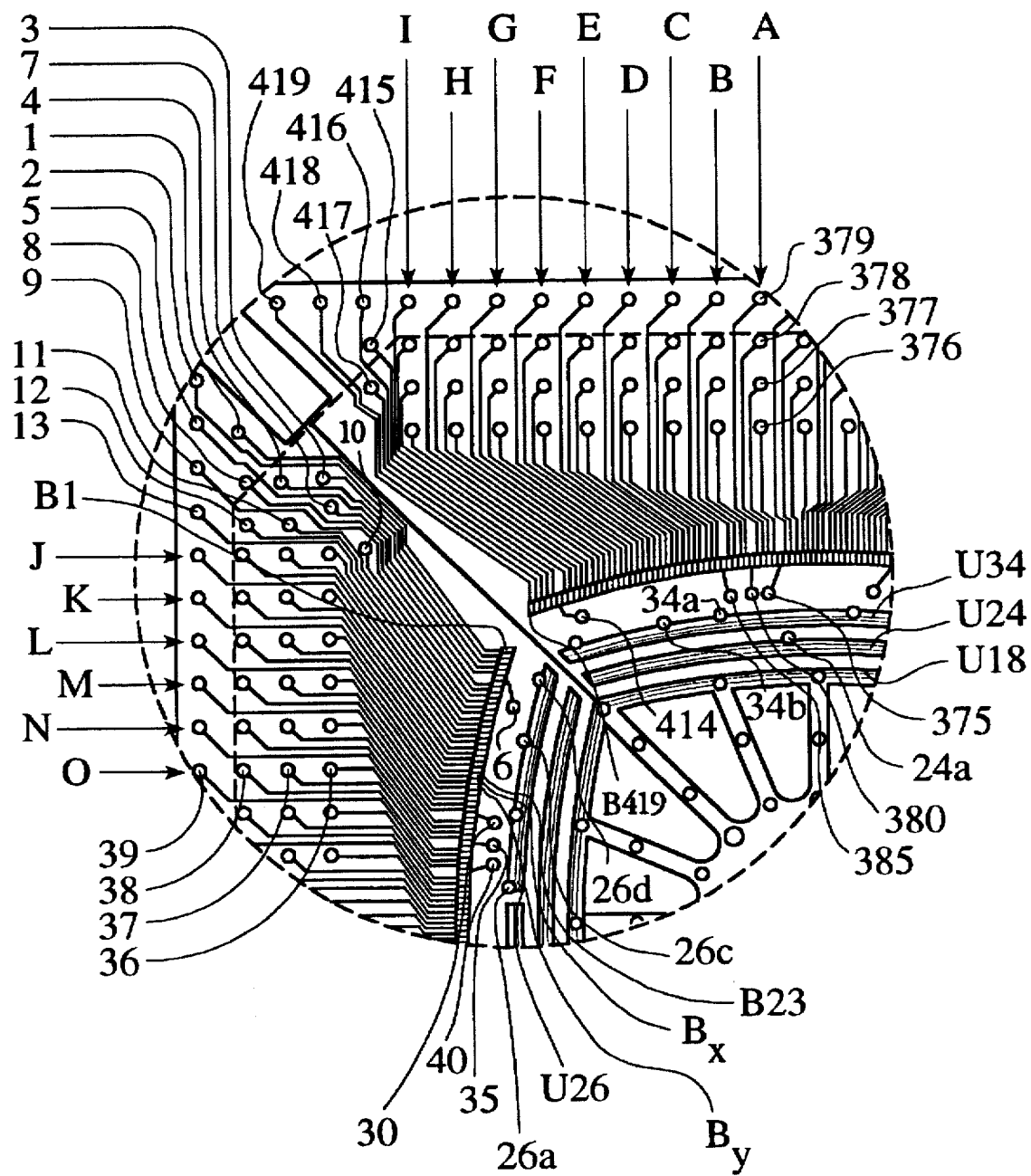
FIG. 4 illustrates a blow-up of the region 4 shown in FIG. 1.

Turning now to FIGS. 1 and 4, attention is drawn to the bond sites 38 located on the top side of the BGA substrate 10. As shown in FIG. 1, the bond sites are arranged in a generally linear fashion on each of the four sides of the die-attach region 12. FIG. 4 is a magnified portion of the top side of the BGA substrate 10, as shown by the dashed circle 4 in FIG. 1, illustrating in greater detail the linear ordering of some of the bond sites. By comparison, the grid pattern arrangement of the solder bumps (FIG. 3) is a two-dimensional configuration.

In accordance with the present invention, the bond sites 38 are numbered in a sequential fashion. For example, in an embodiment of the present invention as illustrated in FIG. 4, a first bond site B1 is identified. The remaining 418 bond sites are sequentially identified by numbering the bond sites in counterclockwise order, ending with a last bond site B419. The preferred embodiment of the present invention contemplates a BGA substrate wherein the bond sites are used only for providing access to signals to and from the semiconductor die, as opposed to providing utilities such as ground and power. It is the goal of the present invention to preserve the linear ordering of the bond sites on the grid of solder bumps.

In an alternate embodiment, the bond sites of a BGA substrate are composed of a combination of signal bond sites and utility bond sites. In this embodiment, sequential identification of the bond sites is limited to the signal bond sites, so that the numbering would skip over the utility bond sites. Thus, in FIG. 4, if all the bond sites are signal bond sites, then bond sites $B_x$ and $B_y$ would be respectively numbered B24 and B25. If, on the other hand, bond site $B_x$ is a utility bond site, then the numbering would exclude bond site $B_x$ so that bond site $B_y$ would be identified as B24.

Figure 6:
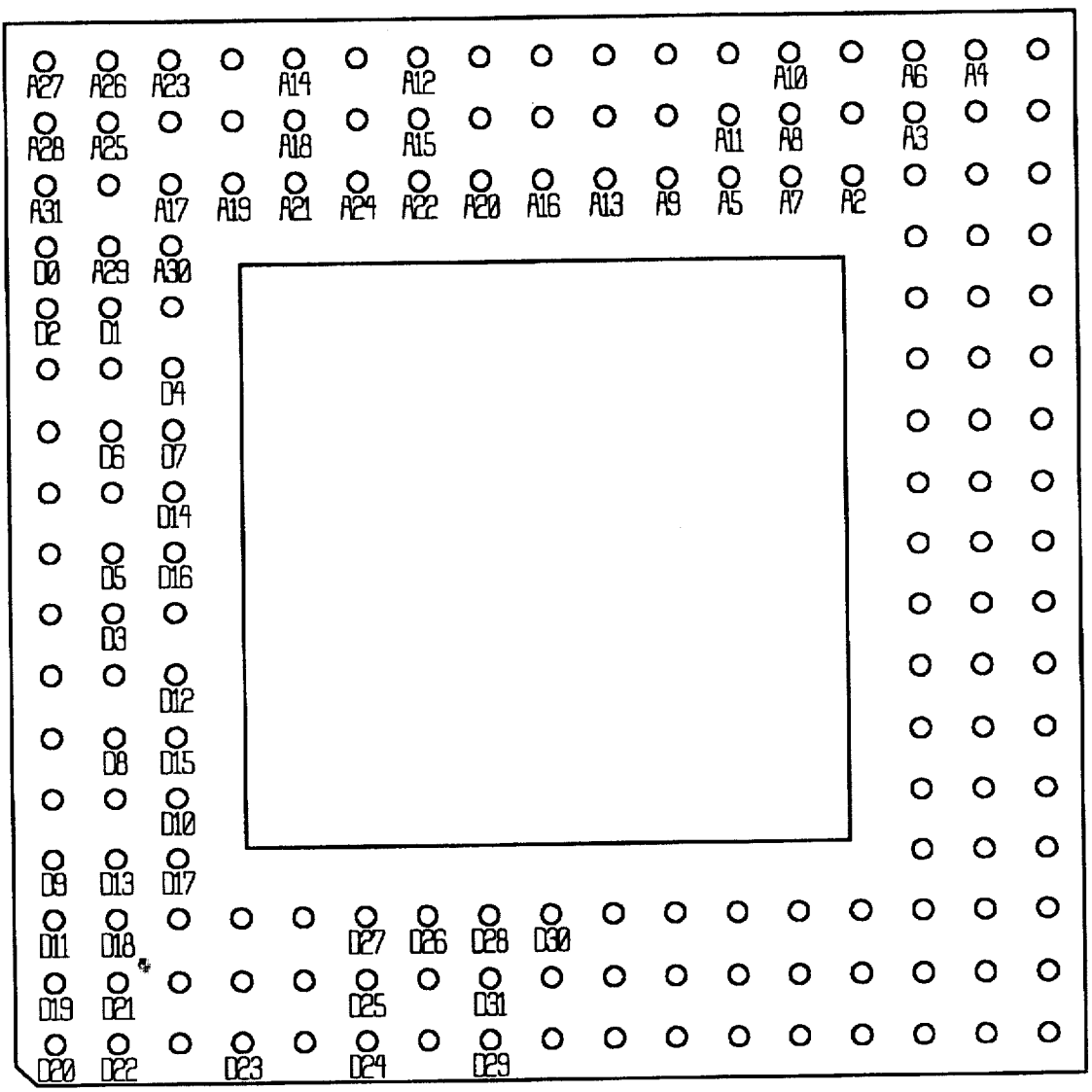
FIG. 6 shows the address and data pin locations on the pin grid array of an Intel® i486 microprocessor.
Figure 7:
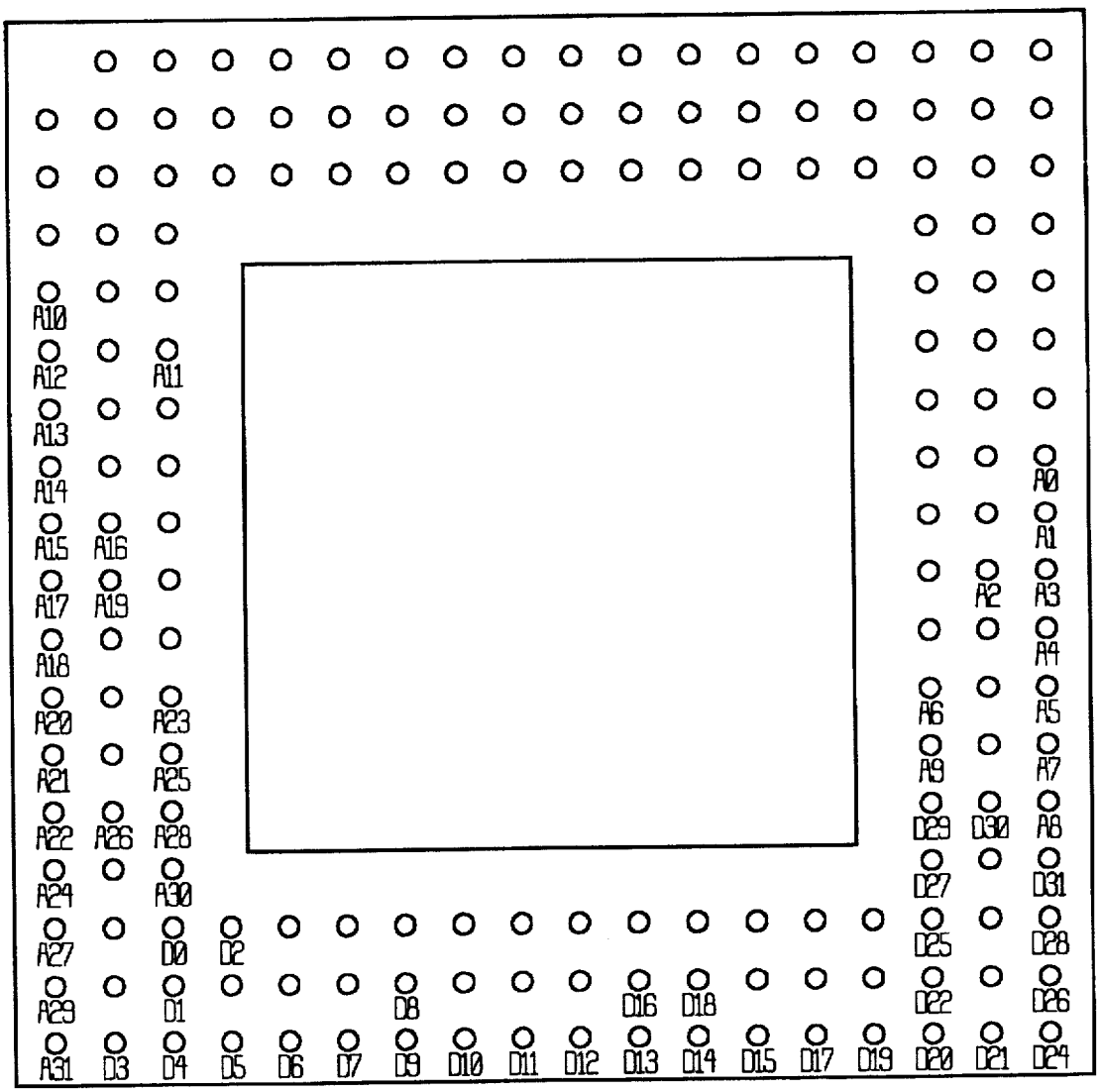
FIG. 7 shows the address and data pin locations on the pin grid array of a Motorola® MC68040 microprocessor.

Whereas the prior art ball-grid array substrates have arbitrary assignments of bond sites to solder bumps, as exemplified by the address and data pins of the Intel® and Motorola® chips shown in FIGS. 6 and 7, the present invention provides a mapping between the signal bond sites and the solder bumps based upon the sequential ordering of the bond sites and the solder bumps. Thus, the first signal bond site is mapped to and corresponds with the first signal solder bump, the second bond site to the second solder bump, and so on. In this way, the generally linear sequential ordering of the bond sites is preserved when they are presented on the two-dimensional grid-like pattern of signal solder bumps. The result is less scrambling in the order of the I/O pads of the semiconductor die as they are brought out to the solder bumps when compared to the prior art pin-outs. A mapping of bond sites to solder bumps in accordance with the present invention will now be described.

FIG. 4 shows, in greater detail, the signal traces connecting the bond sites to the signal vias. The signal vias are numbered according to the bond sites to which they are connected. As mentioned above, the bond sites are arranged in a generally linear order around the die-attach region 12 (FIG. 1) and are sequentially numbered in a counterclockwise order, beginning with the first bond site B1. Thus, the first bond site B1 is coupled to a first signal via 1, as can be seen by following the signal trace from the bond site to the via. Likewise, the second bond site B2 is coupled to a second signal via 2. The remaining 417 bond sites are coupled to corresponding vias in this manner, so that the last bond site B419 is coupled to a last signal via 419. For example, bond sites B1–B13 and B415–B419 in FIG. 4 are shown coupled to their corresponding vias 1–13 and 415–419.

In order to avoid cluttering the diagram in FIG. 4 with reference numerals, some of the signal vias are shown in groups of four, indicated by the arrows and identified by reference letters A–O. Each reference letter identifies the signal vias in a group beginning with the signal via furthest from the edge of the BGA substrate 10 (FIG. 1). For example, each via in the first group A is identified as shown in FIG. 4 by the reference numerals 376–379. Likewise, the vias in the last group O are identified by the reference numerals 36–39. The vias in the remaining groups are numbered in the same manner. Thus, the groups B–N are numbered as: B, 381–384; C, 386–389; D, 390–393; E, 394–397; F, 398–401; G, 402–405; H, 406–409; I, 410–413; J, 14–17; K, 18–21; L, 22–25; M, 26–29 and N, 31–34.

FIG. 4 shows that the signal vias 6, 30, 35, 40, 375, 380, 385 and 414 are located on a side of the bond sites, opposite most of the other signal vias. These vias are coupled by signal traces to their corresponding bond sites B6, B30, B35, B40, B375, B380, B385 and B414. Although these bond sites are not explicitly numbered, they can be identified by following the signal traces that connect the vias to the corresponding bond sites as shown in the magnified view in FIG. 4. The utility traces shown in FIG. 1, are identified in FIG. 4 by prepending the letter "U" to their reference numerals U18, U24, U26 and U34, in order to distinguish the signal vias. Some of the utility vias 24 a, 26 a to 26 d and 34 a to 34 c are shown to provide a point of reference for the discussion of FIG. 5.

Figure 5:
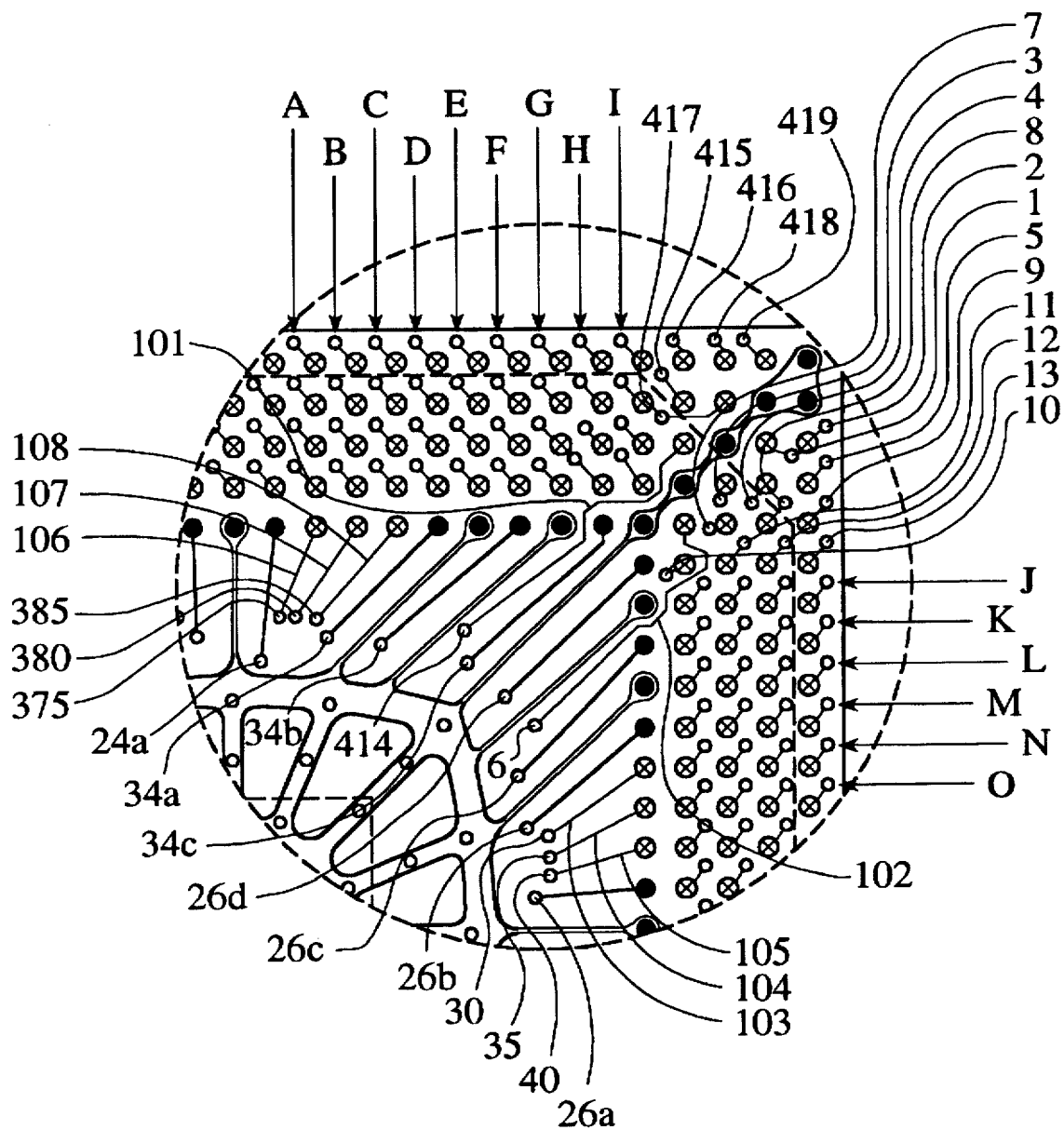
FIG. 5 illustrates a blow-up of the region 5 shown in FIG. 2.

As will now be shown, the couplings between the bond sites and the signal vias (FIGS. 1 and 4) and between the signal vias and the signal solder bumps (FIGS. 2 and 5) result in a mapping of the linearly ordered sequence of the bond sites B1–B419 onto the two-dimensional grid-like pattern of signal solder bumps (FIG. 3) in a manner that preserves the linear ordering of the bond sites. FIG. 5 shows a magnified portion of the bottom side of the BGA substrate, as indicated by the dashed circle 5 that appears in FIG. 2. FIG. 5 illustrates the other side of the portion of the BGA substrate, shown in FIG. 4, as would be seen by turning the substrate over to expose its bottom side.

The signal solder bumps are shown in FIG. 5 as the circles having "X"s. The solder bumps are arranged in a grid-like pattern and are sequentially numbered based upon the grid pattern as described with reference to FIG. 3. In FIG. 5, the signal vias appear on the bottom side as open circles and are shown coupled by signal traces to corresponding solder bumps. The utility vias 24a, 26a to 26d and 34a to 34c, shown in FIG. 4, also appear in FIG. 5 to provide a reference point. In order to simplify numbering of the elements, some of the vias shown in FIG. 5 are grouped together and numbered in the same manner as described for FIG. 4. Thus, the groups of signal vias A–O are numbered as: A, 376–379; B, 381–384; C, 386–389: D, 390–393; E, 394–397; F, 398–401; G, 402–405; H, 406–409; I, 410–413; J, 14–17; K, 18–21; L, 22–25; M, 26–29; N, 31–34 and O, 36–39. The corresponding solder bumps to which the vias are coupled can be identified by referring to FIG. 3.

In accordance with the present invention, the signal vias are routed to solder bumps such that the sequence or ordinal numbers of the solder bumps match the order of the bond sites located on the top side of the BGA substrate. Thus, the signal via 1 provides an electrical path between the first signal solder bump 1 (FIGS. 3 and 5) and the first bond site B1 (FIG. 4), the signal via 2 provides an electrical path between the second signal solder bump 2 and the second bond site B2, and so on. This one-to-one correspondence exists between each one of the sequentially numbered bond sites (FIG. 4) and each of the solder bumps in the sequentially ordered grid of signal solder bumps (FIG. 3).

Since most of the vias are arranged along a grid pattern similar to the grid pattern of the solder bumps, the vias are generally aligned with the solder bumps in sequential order. For example, the signal vias 390–413 (groups D–I) are proximally positioned to their corresponding solder bumps in proper sequence. Likewise, the signal vias 14–29 (groups J–M) are positioned near to their corresponding solder bumps.

Some of the signal vias, however, must be routed by a signal trace in order to be coupled to their solder bumps in proper sequence. For example, as shown in FIG. 5, the signal via 414 must be routed by a signal trace 101 to be coupled to the proper solder bump, namely solder bump 414 (FIG. 3). Likewise, the signal via 6 must be routed in a similar fashion by a signal trace 102 in order to be coupled to the proper solder bump, namely solder bump 6. Other signal vias 30, 35, 40, 375, 380 and 385 are similarly coupled to their respective solder bumps by the signal traces 103–108.

Thus, the bond sites are brought out to the signal solder bumps so that the linear ordering of the bond sites is preserved on the two-dimensional grid-like array of signal solder bumps. Likewise, the linear ordering of the die bond pads of a semiconductor die are preserved on the ball grid array, since typically wire bonding results in a one-to-one correspondence between the die bond pads and the bond sites. Since logically related groups of signals, e.g. an address bus or a data bus, generally are sequentially arranged on the die bond pads, these signal will be mapped on the ball grid array in a sequential order, such as the ordering shown in FIG. 3.

Figure 8:
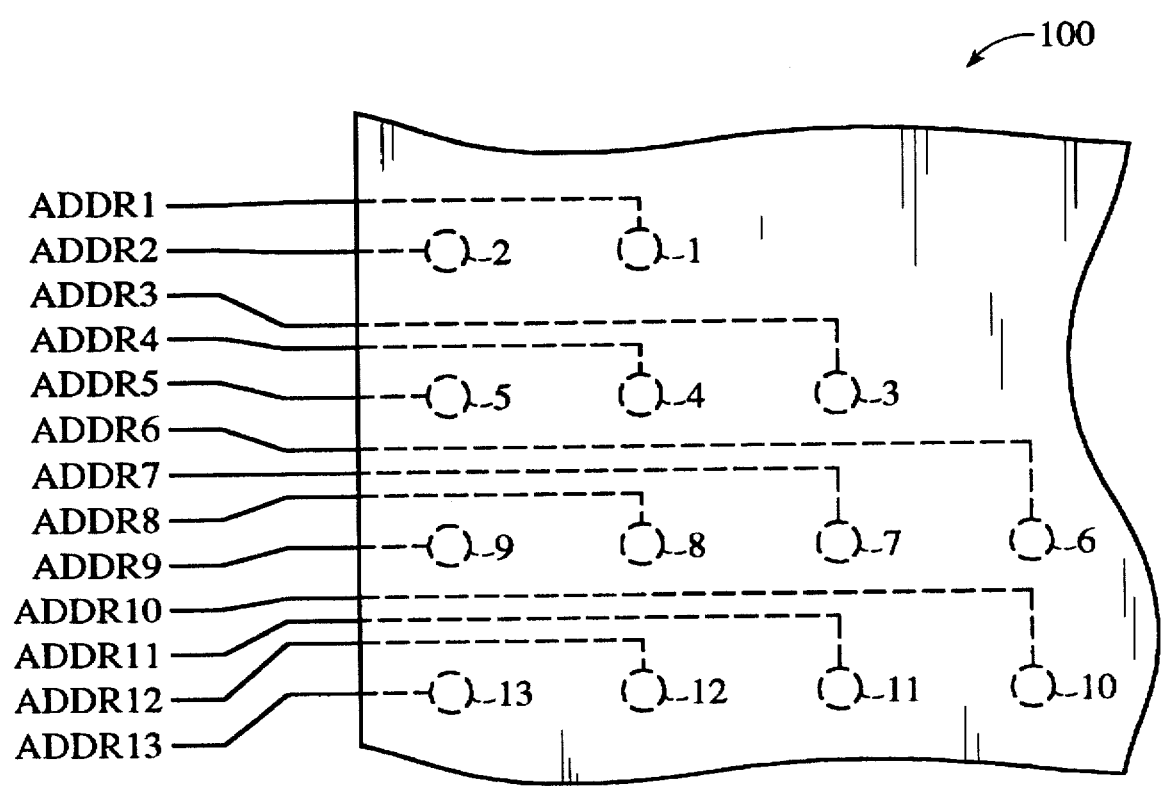
FIG. 8 shows a portion of an IC chip incorporating the BGA substrate of the present invention.

The advantage of such a mapping is that the signal traces on a PC motherboard can be routed without having to cross any of the traces, which would require routing such traces along another layer of the PC board. FIG. 8 illustrates this point. FIG. 8 is a top view of a portion of an IC chip 100 mounted on a PC motherboard (not shown) and incorporating the ball grid array of the present invention. The relative dimensions are exaggerated for clarity. A corresponding portion of the underlying solder bumps 1–13 of the ball grid array are indicated by dashed circles. The numbering of these solder bumps follows the convention shown in FIG. 3. FIG. 8 also shows address bus lines ADDR1–ADDR13 formed on the PC motherboard. Assuming that the semiconductor die (not shown) of the chip 100 presents its address lines on the first thirteen die bond pads, those address lines would appear on the solder bumps 1–13 of the ball grid array, respectively.

It is clear that the address lines ADDR1–ADDR13 have direct paths to their corresponding solder bumps. The traces on the PC motherboard are not crossed and so do not need to be run on a separate layer. This is made possible because the address signals are grouped together on the ball grid array and are arranged on the array in a way that preserves the linear order of the signals on the semiconductor die pads. By comparison, the prior art pin grid arrays shown in FIGS. 6 and 7 show a scattered arrangement of data and address signals which are mixed in with other signal pins (not shown). PC boards designed for these prior art chips will invariably require the use of one or more additional layers for routing signal traces in order to avoid crossing the signal traces.

We claim:

1. A chip package comprising:
   an insulative member having first and second sides;
   a die-attach region disposed on said first side;
   a plurality of bond sites spaced apart from and surrounding said die-attach region on said first side, at least some of said bond sites being signal bond sites, said signal bond sites being sequentially numbered, so that each of said signal bond sites is identified by a sequence number; and
   a plurality of solder bumps formed on said second side, at least some of said solder bumps being signal solder bumps, said signal solder bumps being disposed on said second side along a grid pattern and being sequentially numbered, so that each of said signal solder bumps is identified by a sequence number;
   at least one bond site of said signal bond sites having a correspondence with one solder bump of said signal solder bumps such that said bond site and said solder bump have the same sequence number, said bond site further having an electrical connection to said solder bump.

2. The chip package of claim 1 wherein said electrical connection includes an electrically conductive signal via formed through said insulative member and a signal trace formed on said first side of said insulative member and connected to provide an electrical path between said one bond site and said signal via, said via being electrically coupled to said corresponding solder bump.

3. The chip package of claim 2 wherein said one bond site is a first trace end of said signal trace.

4. The chip package of claim 2 further including a signal trace formed on said second side of said insulative member and connected between said via and said corresponding solder bump.

5. The chip package of claim 2 wherein said first side of said insulative member includes a first region enclosed by said plurality of bond sites and a second region exclusive of said first region; said via being disposed in one of said first region and said second region.

6. The chip package of claim 1 wherein each of said signal bond sites corresponds to one of said signal solder bumps such that said each signal bond site and said corresponding signal solder bump have the same sequence number and have an electrical path therebetween.

7. A chip package comprising:
   a substrate having a first surface and a second surface opposite said first surface;
   a plurality of sequentially numbered bond sites spaced apart from and surrounding said die-attach region on said first surface, each bond site being identified by an ordinal number representing the order of said bond site in said sequence of bond sites;
   a grid pattern defined on said second surface; and
   a first plurality of solder bumps disposed on said second surface and arranged along said grid pattern, each solder bump being identified by an ordinal number representing a sequential order of said solder bump in said grid pattern;
   each of said bond sites having a correspondence with one of said solder bumps such that the ordinal number of each bond site is the same as the ordinal number of said corresponding solder bump;
   a plurality of path means for providing an electrical paths between said bond sites and the corresponding solder bumps.

8. The chip package of claim 7 wherein said plurality of path means includes:
   electrically conductive vias formed through said substrate; and
   signal traces formed on said first surface of said substrate;
   said vias being electrically connected to said bond sites by said signal traces;
   said vias further being electrically connected to the solder bumps corresponding to said bond sites.

9. The chip package of claim 8 further including, on said first surface, an interior region surrounding said die-attach region and an exterior region surrounding said interior region; said plurality of sequentially numbered bond sites being arranged along the boundary between said interior region and said exterior region, and each of said vias being disposed within in one of said interior region and said exterior region.

10. The chip package of claim 9 further including a signal trace formed on said second surface, said signal trace connected between one of said vias and one of said solder bumps.

11. The chip package of claim 8 wherein said bond sites are first ends of said signal traces, and said signal traces are connected to said vias at second ends of said signal traces.

12. The chip package of claim 7 further including a second plurality of solder bumps arranged along said grid pattern, wherein said first plurality of solder bumps are signal solder bumps and said second plurality of solder bumps are utility solder bumps.

13. The chip package of claim 7 wherein bond sites in said plurality of sequentially numbered bond sites that are identified by ordinal numbers are limited to signal bond sites.

14. A chip carrier comprising:
   an electrically insulative member having first and second surfaces;
   a die-attach region disposed on said first surface;
   a plurality of traces formed on said first surface, said traces having first trace ends disposed in spaced relation to said die-attach region, at least some of said traces being signal traces, said first trace ends being linearly ordered, first trace ends of said signal traces being defined as signal trace ends and having positional numbers representing the position of said signal trace ends within said linearly ordered first trace ends;
   a plurality of solder balls formed on said second surface and arranged in a sequentially ordered grid pattern, at least some of said solder balls being signal solder balls, said signal solder balls being sequentially numbered based upon said sequentially ordered pattern, so that each said signal solder ball has a sequence number; and a plurality of electrically conductive vias formed through said insulative member;

one of said signal traces having a correspondence to one of said signal solder balls such that the positional number of the signal trace end of said one signal trace is the same as the sequence number of said one signal solder ball;

one of said plurality of vias being electrically connected to the second trace end of said one signal trace and being electrically connected to said one signal solder ball.

15. The chip carrier of claim 14 wherein each signal trace of said signal traces corresponds to each of said signal solder balls such that the positional number of the signal trace end of said each signal trace is the same as the sequence number of said each signal solder ball.

16. The chip carrier of claim 14 further including an intermediate region upon said first surface of said electrically insulative member that surrounds said die-attach region and is bounded by said first trace ends, and an outer region that surrounds said intermediate region; each of said plurality of vias being in disposed in one of said intermediate region and said outer region.

17. The chip carrier of claim 14 wherein at least some of said plurality of vias are arranged in a grid pattern.

18. The chip carrier of claim 14 further including at least one signal trace formed on said second surface of said electrically insulative member, said signal trace connecting one of said vias to one of said signal solder balls.

* * * * *